(12) United States Patent
Huh

(10) Patent No.: US 8,179,722 B2
(45) Date of Patent: May 15, 2012

(54) PAGE BUFFER CIRCUIT AND NONVOLATILE MEMORY DEVICE

(75) Inventor: Hwang Huh, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 221 days.

(21) Appl. No.: 12/650,766

(22) Filed: Dec. 31, 2009

(65) Prior Publication Data

US 2010/0195386 A1 Aug. 5, 2010

(30) Foreign Application Priority Data

Feb. 2, 2009 (KR) .................. 10-2009-0008070

(51) Int. Cl.
*G11C 16/06* (2006.01)
(52) U.S. Cl. ......... 365/185.12; 365/185.21; 365/189.09; 365/207; 365/196; 365/203
(58) Field of Classification Search ............ 365/185.12, 365/185.21, 189.09, 154, 207, 196, 203
See application file for complete search history.

(56) References Cited

U.S. PATENT DOCUMENTS

2003/0169621 A1* 9/2003 Kawamura ............... 365/185.03

FOREIGN PATENT DOCUMENTS

| KR | 100244864 | 3/2000 |
| KR | 100769782 | 10/2007 |

OTHER PUBLICATIONS

Notice of Preliminary Rejection issued from Korean Intellectual Property Office on Aug. 27, 2010.

* cited by examiner

*Primary Examiner* — Thong Q Le
(74) *Attorney, Agent, or Firm* — IP & T Group LLP

(57) ABSTRACT

A page buffer circuit comprises a sense amplification unit configured to compare a reference voltage and a bit line voltage of a bit line of a selected memory block and to increase a voltage level of a sense node by a difference between the reference voltage and the bit line voltage, wherein the bit line voltage is subject to being changed according to a program state of a selected memory, and a number of latch circuits configured to latch program verification data according to the voltage level of the sense node.

10 Claims, 6 Drawing Sheets

PAGE BUFFER CIRCUIT AND NONVOLATILE MEMORY DEVICE

CROSS-REFERENCE TO RELATED APPLICATION

Priority to Korean patent application number 10-2009-0008070 filed on Feb. 2, 2009, the entire disclosure of which is incorporated by reference herein, is claimed.

BACKGROUND

Exemplary embodiments relate to a nonvolatile memory device and, more particularly, to a page buffer circuit and a nonvolatile memory device which are capable of storing 3-bit information.

Examples of nonvolatile memory device are random access memory (RAM), which enables the writing and erasure of data and loses data upon entering a power-down down, and read only memory (ROM), which retains data upon entering a power-down mode and thus has recently been widely used for the storage media of portable electronic devices, such as digital cameras, personal digital assistant (PDAs), and MP3 players.

The nonvolatile memory device may include a memory cell array, a row decoder, a page buffer unit, etc. The memory cell array may include a plurality of word lines arranged in rows, a plurality of bit lines arranged in columns, and a plurality of cell strings corresponding to respective bit lines.

Memory cells may have varying threshold voltages according to their program states. Ideally, the memory cells have the same threshold voltage according to the state of data to be stored. However, in practice, when a program operation is performed on the memory cells, the threshold voltages of the memory cells often have a different probability distribution in each region because of various external environments, such as the device characteristics and the coupling effect.

FIG. 1A is a block diagram of a nonvolatile memory device.

Referring to FIG. 1A, the nonvolatile memory device 100 includes a memory cell array 110, a page buffer unit 120, a Y decoder 130, an X decoder 140, a voltage supply unit 150, and a control unit 160.

The memory cell array 110 includes memory cells selected on a memory-block by memory block (BK) basis and configured to have data written therein and data read therefrom. The memory cells are coupled to word lines and the bit lines. Any one of the memory blocks BK may be selected and enabled, while the remaining memory blocks BK may be disabled. Furthermore, a plurality of the memory blocks BK may share a bit line.

The page buffer unit 120 includes page buffers coupled to the bit lines. The page buffer is configured to store data to be stored in memory cells coupled to a bit line or to read data stored in memory cells and store the read data.

The Y decoder 130 is configured to provide the page buffers with a data IO path. The X decoder 140 is configured to enable a selected memory block and couple each word line with a line for supplying operating voltages.

The voltage supply unit 150 is configured to generate a high voltage for a program, read, or erase operation, and the control unit 160 is configured to control the operation of the nonvolatile memory device 100 for the program, read, or erase operation.

FIG. 1B is a circuit diagram of a page buffer of the page buffer unit 120 shown in FIG. 1A.

Referring to FIG. 18, the page buffer includes a bit line selection unit 121, a sense unit 122, a precharge unit 123, a latch unit 124, a data sense unit 125, and first and second verification units 126, 127.

The bit line selection unit 121 is configured to select an even bit line BLE and an odd bit line BLO in response to bit line selection signals SELBLE, SELBLO. The sense unit 122 is configured to sense voltage of a selected bit line and to change a voltage level of the sense node SO to the sensed voltage.

The precharge unit 123 is configured to precharge the sense node SO, and the latch unit 124 is configured to receive and store data to be programmed or to store read data. The data sense unit 125 is configured to control the latch unit 124 according to a voltage level of the sense node SO so that data of the latch unit 124 are retained or changed.

The first and second verification units 126, 127 are coupled to a latch node of the latch unit 124 and are configured to output a verification signal indicating whether a program verification operation has been completed.

In such a nonvolatile memory device, with an increase in the number of bits that can be stored per memory cell, the number of threshold voltages used for determining the stored bits and distributions of the threshold voltages among memory cells increase, and the number of times that verification tests for checking whether program operations on memory cells are passes (for example, a pass is a state where a program has been successfully performed) is increased.

Accordingly, a fast verification method for performing a program verification operation using two or more verification voltages through one precharging of a bit line has been developed.

The fast verification method may be performed by precharging a bit line in order to perform a program verification operation and consecutively performing program verification operations while sequentially raising a verification voltage applied to a selected word line.

More specifically, in such a fast verification method, after applying a first verification voltage to the selected word line, a first evaluation operation of a voltage of the bit line is performed. It is then checked whether the bit line voltage has changed. If, as a result of the check, a selected memory cell has a threshold voltage larger than the first verification voltage, the bit line remains in the precharge state.

In response to the determination that the selected memory cell has a threshold voltage larger than the first verification voltage, a second evaluation operation may be performed by applying a second verification voltage larger than the first verification voltage to the selected word line. If, during the second evaluation operation, the bit line remains in the precharge state, the selected memory cell may be determined to have a threshold voltage larger than the second verification voltage.

As described above, a program verification operation using several verification voltages can be performed with one precharging of a bit line. In reference to the structure of the memory cell array 100 of the nonvolatile memory device, unselected memory blocks BK that are also coupled to the precharged bit line are disabled. However, leakage current may be generated through the bit lines coupled to the unselected memory blocks. When an evaluation operation is consecutively performed without precharging a bit line, a concern is raised in that the voltage level of the bit line is gradually decreased due to the bit line leakage current flowing through the unselected memory blocks. Accordingly, in a conventional fast verification method, the number of times in which a program verification operation can be performed through one precharging of a bit line may be limited to two to three times.

SUMMARY OF THE INVENTION

Exemplary embodiments relate to a page buffer circuit and a nonvolatile memory device which are capable of performing a larger number of fast sensing operations through one precharging of a bit line by compensating for the leakage current.

A page buffer circuit according to an aspect of the present invention comprises a sense amplification unit configured to compare a reference voltage and a bit line voltage of a bit line of a selected memory block and to increase a voltage level of a sense node by a difference between the reference voltage and the bit line voltage, wherein the bit line voltage is subject to being changed according to a program state of a selected memory cell, and a number of latch circuits configured to latch program verification data according to the voltage level of the sense node.

The reference voltage is a voltage that changes according to a voltage decrease resulting from a leakage current of the bit line when the bit line is precharged, wherein the bit line is shared by the selected block with unselected memory blocks.

The sense amplification unit comprises an amplification circuit with components that are cross-coupled.

A nonvolatile memory device according to another aspect of the present invention comprises a memory cell array including a number of memory blocks, each memory block comprising memory cells coupled to a number of word line and a number of bit lines to form a first bit line group and a second bit line group, and a page buffer unit configured to include page buffers, each page buffer being coupled to at least one of first bit lines included in the first bit line group and configured to, when a program verification operation is performed, compare a second bit line voltage changed by a voltage decrease resulting from a leakage current from a second bit line included in the second bit line group and a first bit line voltage of a first bit line included in the first bit line group, the first bit line voltage being changed according to a program state of a selected memory cell, increase a voltage level of a sense node by a difference between the first and second bit line voltages, and store verification data according to the voltage level of the sense node.

A nonvolatile memory device according to yet another aspect of the present invention comprises a memory cell array including a number of memory blocks, each memory block comprising memory cells coupled to a number of word lines and a number of bit lines, and a voltage control unit configured to, in response to a voltage decrease resulting from a leakage current of a bit line shared by a memory block selected for program with unselected memory blocks of the memory cell array, and to increase a voltage level of a sense node of a page buffer by an amount of the voltage decrease before verification data are checked in a fast program verification operation of the selected memory block.

DETAILED DESCRIPTION OF EMBODIMENTS

Hereinafter, exemplary embodiments of the present disclosure will be described in detail with reference to the accompanying drawings. The figures are provided to allow those having ordinary skill in the art to make and use exemplary embodiments of the disclosure.

Figure 1A:
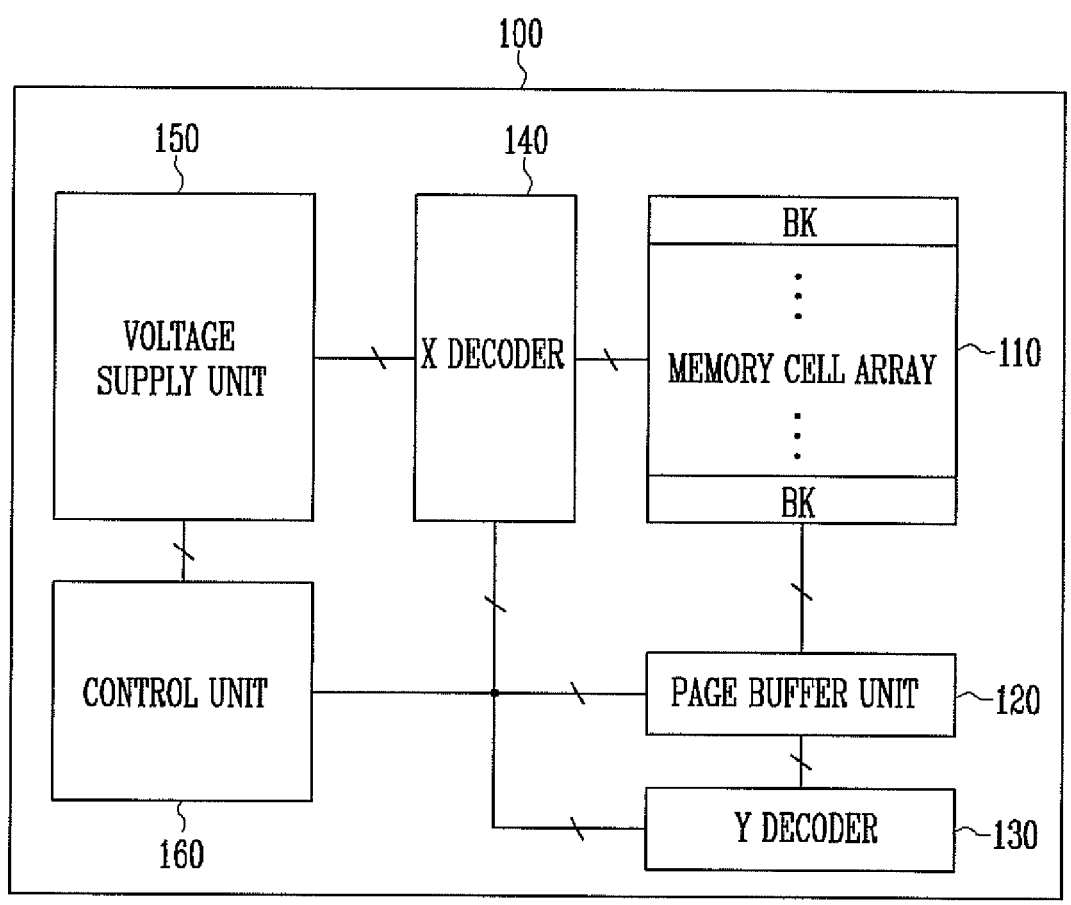
FIG. 1A is a block diagram of a nonvolatile memory device.
Figure 1B:
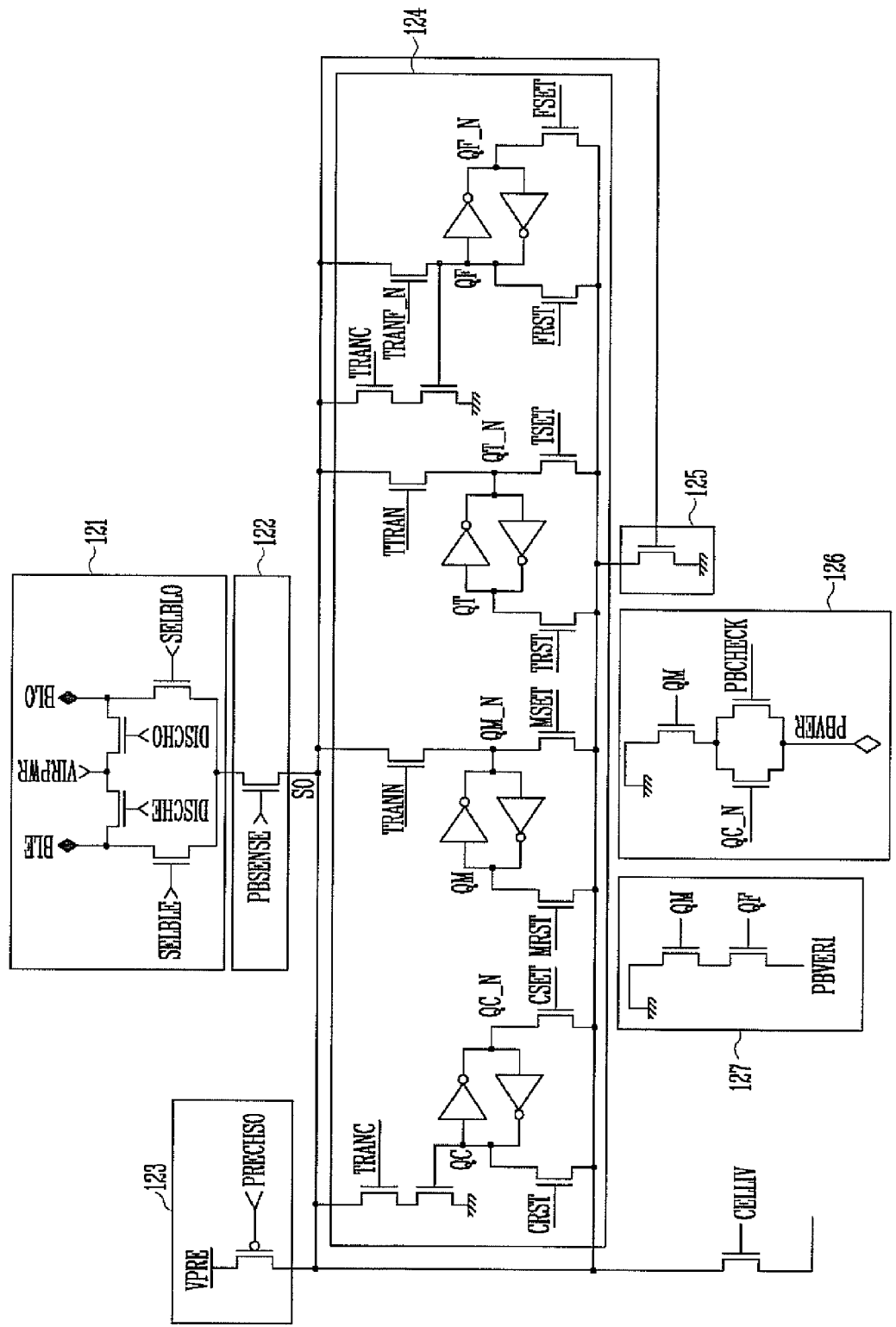
FIG. 1B is a circuit diagram of a page buffer of the page buffer unit shown in FIG. 1A.
Figure 2A:
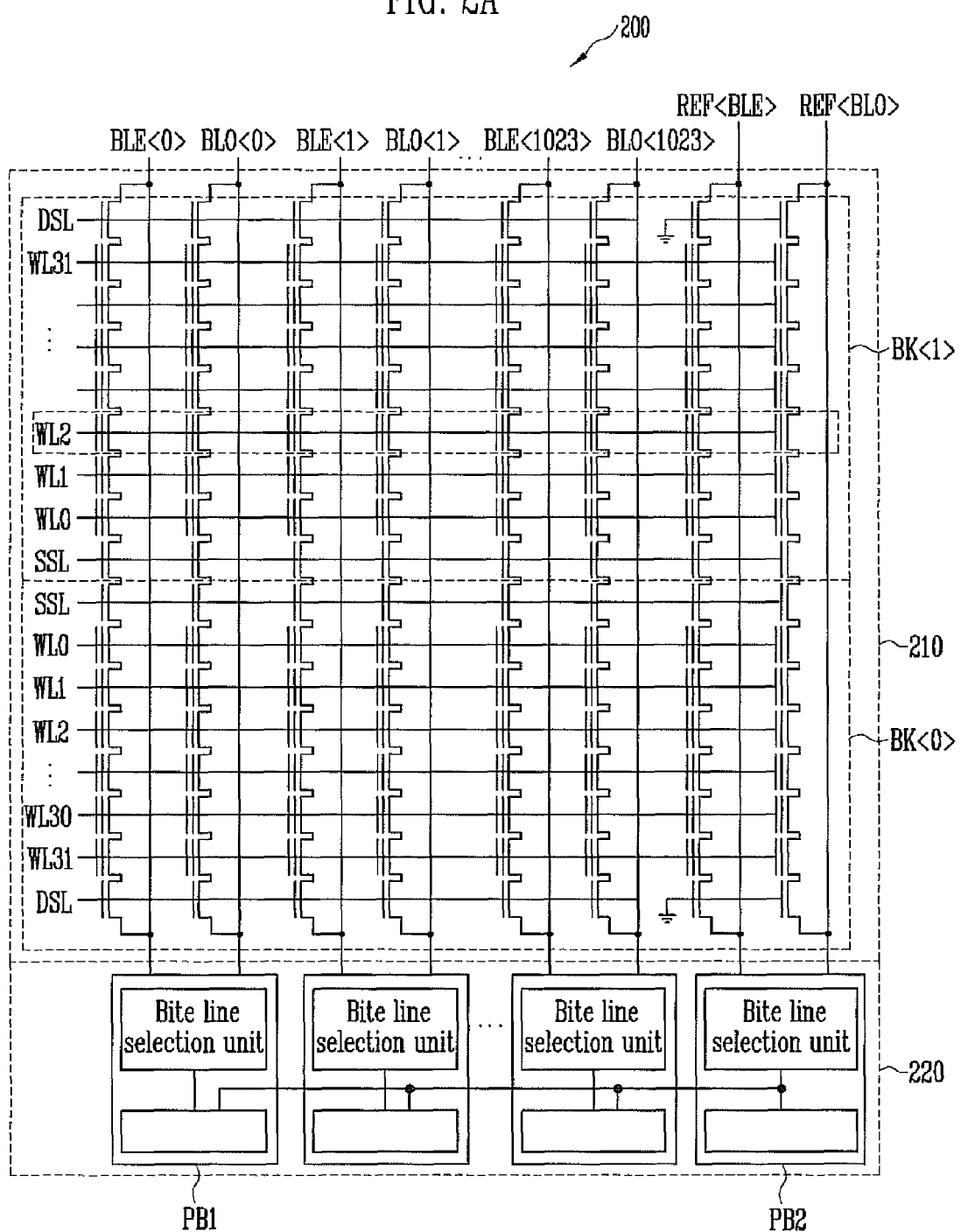
FIG. 2A is a diagram of a nonvolatile memory device according to an embodiment of the present invention.

FIG. 2A is a diagram of a nonvolatile memory device according to an embodiment of the present invention.

Referring to FIG. 2A, the nonvolatile memory device 200 according to the embodiment of the present invention includes a memory cell array 210 and a page buffer unit 220, where FIG. 2A illustrates components of the nonvolatile memory device 200 that are reasonably relevant for understanding the exemplary embodiment.

The memory cell array 210 includes a number of memory blocks BK<0:n> (only BK<0:1> are shown). The memory blocks each include a plurality of memory cells. The memory cells according to an example form a number of cell strings. The cell strings are coupled to respective bit lines, where the cell strings of the memory blocks BK<0:n> share respective bit lines.

For example, the bit lines may include $0^{th}$ to $1023^{th}$ even bit lines BLE<0:1023> and $0^{th}$ to $1023^{th}$ odd bit lines BLO<0:1023>. The bit lines further include reference bit lines REF_BLE and REF_BLO in order to address the concern that a bit line voltage may be decreased due to the leakage current flowing through unselected memory blocks during the performance of a fast program verification operation.

Furthermore, each pair of the even bit lines and the odd bit lines is coupled with a page buffer PB1.

The page buffer unit 220 includes a number of the page buffers PB. A page buffer PB2 is coupled to the reference bit lines REF_BLE, REF_BLO. A circuit, including the reference bit lines REF_BLE, REF_BLO and the page buffer PB1, may be used to provide a reference voltage for determining a degree in which a bit line voltage is decreased due to a leakage current flowing through unselected blocks. A voltage control unit may be used to measure a degree in which a bit line voltage is changed (for example, by use of the reference voltage) according to the leakage current of unselected blocks and to amplify a voltage of the sense node of a page buffer PB for a selected bit line when a result of verification is latched during a program verification operation based on a result of the measurement.

According to an example, the leakage current flowing through unselected blocks may flow through the reference bit lines. After a bit line is precharged in order to perform a program verification operation, a voltage decrease resulting from the leakage current may occur. Such a voltage decrease resulting from the leakage current may be compensated for by using a bit line voltage of the reference bit lines as the reference voltage.

Here, memory cells coupled to the reference bit lines REF_BLE, REF_BLO are in an erase state according an example, but may also be in any of the program states. This is because the gates of drain select transistors DST coupled to the reference bit lines are not coupled to a drain selection line DSL, but are coupled to a ground node Vss as shown, thereby maintaining a turn-off state. Thus, leakage current generated from the reference bit lines REF_BLE, REF_BLO can be accurately measured with the reference bit lines REF_BLE, REF_BLO and the cell strings blocks attached to the reference bit lines REF_BLE, REF_BLO.

The page buffer PB1 coupled to the bit lines on which the program operation is performed is described in more detail below.

Figure 2B:
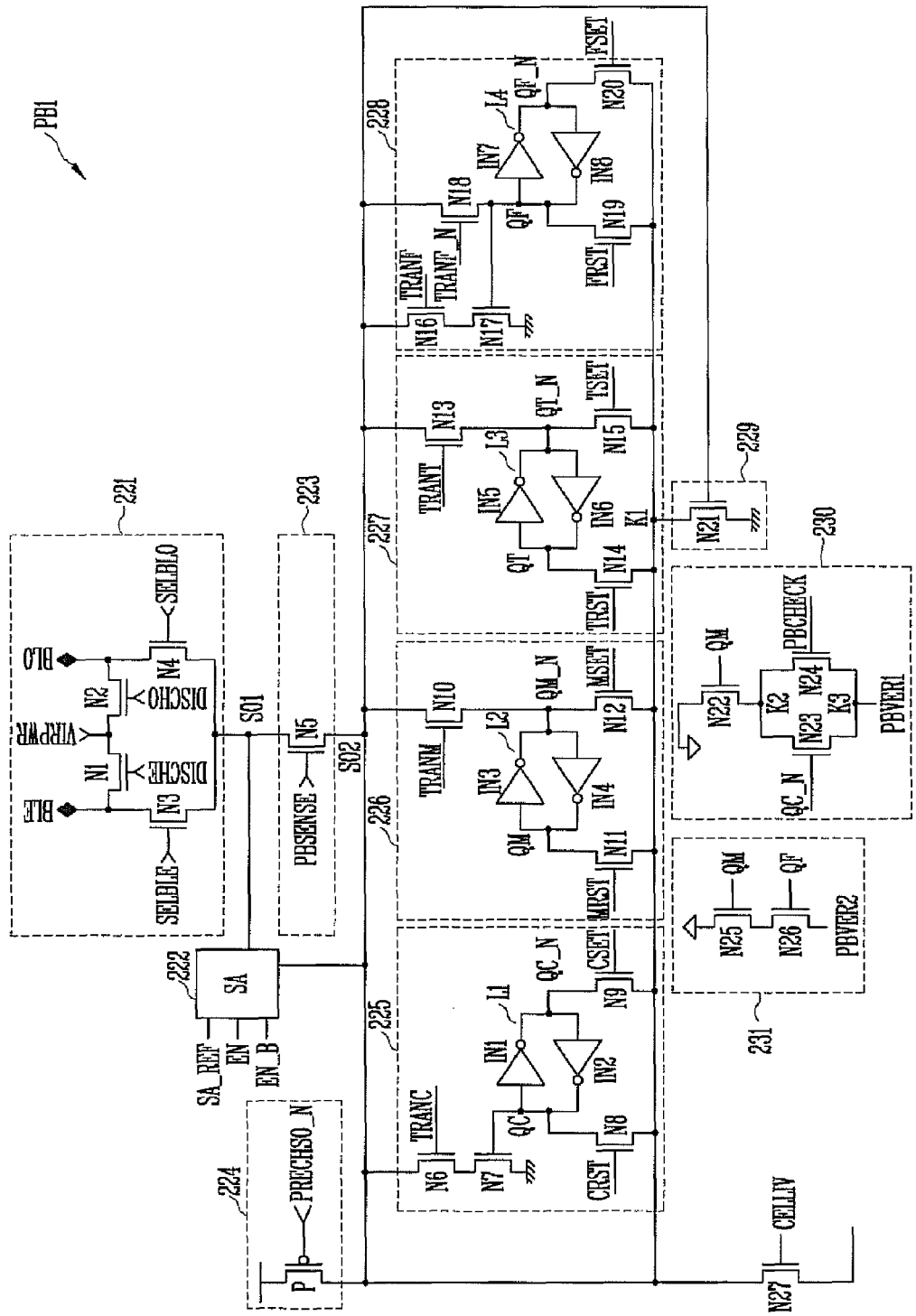
FIG. 2B is a circuit diagram of the page buffer.

FIG. 2B is a circuit diagram of the page buffer.

Referring to FIG. 2B, the page buffer PB1 according to an embodiment of the present invention includes a bit line selection unit 221, a sense amplifier (SA) 222, a sense unit 223, a precharge unit 224, first to fourth latch units 225 to 228, a data sense unit 229, and first and second verification units 230, 231.

The bit line selection unit 221 is configured to select either the even bit line BLE or the odd bit line BLO and to couple a selected bit line with a first sense node SO1. The SA 222 is configured to compare a voltage of the first sense node SO1 and reference voltage SA_REF which is decreased due to the leakage current of unselected blocks flowing through the reference bit lines REF_BLE, REF_BLO and to amplify a voltage level of the second sense node SO2 based on a result of the comparison.

The sense unit 223 is configured to transfer a sensed voltage level of the first sense node SO1 to the second sense node SO2. The precharge unit 224 is configured to precharge the second sense node SO2.

The first to fourth latch units 225 to 228 are coupled between the second sense node SO2 and the data sense unit 229 and are configured to store data to be programmed or read data. The first to fourth latch units 225 to 228 may also store results of program verification.

The first latch unit 225 is a cache latch for receiving data to be programmed. The second latch unit 226 is a main latch for latching data to be programmed. The third latch unit 227 is a temporary latch for performing program and read operations. The fourth latch unit 228 is a flag latch for storing flag data according to program states.

The data sense unit 229 is configured to change the data of a selected latch in response to a voltage level of the second sense node SO2.

The first verification unit 230 is coupled between the first latch unit 225 and the second latch unit 226 and is configured to control the output of a first verification signal PBVER1 for a program verification operation. The second verification unit 231 is coupled between the second latch unit 226 and the fourth latch unit 228 and is configured to control the output of a second verification signal PBVER2 for a program verification operation.

The page buffer PB1 is described in more detail below.

The bit line selection unit 221 includes first to fourth NMOS transistors N1 to N4. The SA 222 includes an amplification circuit of a cross-coupled type. The SA 222 is described in detail below.

The sense unit 223 includes a fifth NMOS transistor N5, and the precharge unit 224 includes a PMOS transistor P.

The first latch unit 225 includes sixth to ninth NMOS transistors N6 to N9 and first and second inverters IN1, IN2. The second latch unit 226 includes tenth to twelfth NMOS transistors N10 to N12 and third and fourth inverters IN3, IN4.

The third latch unit 227 includes thirteenth to fifteenth NMOS transistors N13 to N15 and fifth and sixth inverters IN5, IN6. The fourth latch unit 228 includes sixteenth to twentieth NMOS transistors N16 to N20 and seventh and eighth inverters IN7, IN8.

The data change unit 229 includes a twenty-first NMOS transistor N21, and the first verification unit 230 includes twenty-second to twenty-fourth NMOS transistors N22 to N24. The second verification unit 231 includes twenty-fifth and second-sixth NMOS transistors N25, N26.

The page buffer PB1 further includes a twenty-seventh NMOS transistor N27.

The first and second NMOS transistors N1, N2 are coupled between the even bit line BLE and the odd bit line BLO. A variable voltage VIRPWR is coupled to a node between the first and second NMOS transistors N1, N2.

The third NMOS transistor N3 is coupled between the even bit line BLE and the first sense node SO1, and the fourth NMOS transistor N4 is coupled between the odd bit line BLO and the first sense node SO1.

An even bit line selection signal SELBLE is inputted to the gate of the third NMOS transistor N3, and an odd bit line selection signal SELBLO is inputted to the gate of the fourth NMOS transistor N4.

The fifth NMOS transistor N5 is coupled between the first sense node SO1 and the second sense node SO2, and a sense control signal PBSENSE is inputted to the gate of the fifth NMOS transistor N5.

The PMOS transistor P is coupled between a power supply voltage and the second sense node SO2. A precharge control signal PRECHSO_N is inputted to the gate of the PMOS transistor P.

The sixth and seventh NMOS transistors N16, N7 are coupled in series between the second sense node SO2 and a ground node. A first transmission signal TRANC is inputted to the gate of the sixth NMOS transistor N6. A node QC is coupled to the gate of the seventh NMOS transistor N7.

The first and second inverters IN1, IN2 are coupled between the node QC and node QC_N in a cross-coupled arrangement so as to form a first latch L1.

The eighth NMOS transistor N8 is coupled between the node QC and node K1. The ninth NMOS transistor N9 is coupled between the node QC_N and the node K1. A first reset signal CRST is inputted to the gate of the eighth NMOS transistor N8. A first set signal CSET is inputted to the gate of the ninth NMOS transistor N9.

The tenth NMOS transistor N10 is coupled between the second sense node SO2 and node QM_N. A second transmission signal TRANM is inputted to the gate of the tenth NMOS transistor N10.

The third and fourth inverters IN3, IN4 are coupled between node QM and the node QM_N in a cross-coupled arrangement so as to form a second latch L2.

The eleventh NMOS transistor N11 is coupled between the node QM and the node K1. The twelfth NMOS transistor N12 is coupled between the node QM_N and the node K1. A second reset signal MRST is inputted to the gate of the eleventh NMOS transistor N11. A second set signal MSET is inputted to the gate of the twelfth NMOS transistor N12.

The thirteenth NMOS transistor N13 is coupled between the second sense node SO2 and node QT_N. A third transmission signal TRANT is inputted to the gate of the thirteenth NMOS transistor N13.

The fifth and sixth inverters IN5, IN6 are coupled between a node QT and the node QT_N in a cross-coupled arrangement so as to form a third latch L3.

The fourteenth NMOS transistor N14 is coupled between the node QT and the node K1. The fifteenth NMOS transistor N15 is coupled between the node QT_N and the node K1. A third reset signal TRST is inputted to the gate of the fourteenth NMOS transistor N14. A third set signal TSET is inputted to the gate of the fifteenth NMOS transistor N15.

The sixteenth and seventeenth NMOS transistors N16, N17 are coupled in series between the second sense node SO2 and the ground node. A fourth transmission signal TRANF is inputted to the gate of the sixteenth NMOS transistor N16, and node QF is coupled to the gate of the seventeenth NMOS transistor N17.

The eighteenth NMOS transistor N18 is coupled between the second sense node SO2 and node QF_N. A fifth transmission signal TRANF_N is inputted to the gate of the eighteenth NMOS transistor N18, where an inverted signal of the fourth transmission signal TRANF is the fifth transmission signal TRANF_N.

The seventh and eighth inverters IN7, IN8 are coupled between the node QF and the node QF_N in a cross-coupled arrangement so as to form a fourth latch L4.

The nineteenth NMOS transistor N19 is coupled between the node QF and the node K1. The twentieth NMOS transistor N20 is coupled between the node QF_N and the node K1. A fourth reset signal FRST is inputted to the gate of the nineteenth NMOS transistor N19. A fourth set signal FSET is inputted to the gate of the twentieth NMOS transistor N20.

The twenty-first NMOS transistor N21 is coupled between the node K1 and the ground node, where the second sense node SO2 is coupled to the gate of the twenty-first NMOS transistor N21.

The twenty-second NMOS transistor N22 is coupled between the ground node and the node K2. The twenty-third and twenty-fourth NMOS transistors N23, N24 are coupled between the node K2 and a node K3. The node QM is coupled to the gate of the twenty-second NMOS transistor N22, and the node QC_N is coupled to the gate of the twenty-third NMOS transistor N23. Furthermore, a check signal PBCHECK is inputted to the gate of the twenty-fourth NMOS transistor N24. The first verification signal PBVER1 is outputted from the node K3.

The twenty-fifth and twenty-sixth NMOS transistors N25, N26 are coupled in series between the ground node and the output terminal of a second verification signal PBVER2. The node QM is coupled to the gate of the twenty-fifth NMOS transistor N25, and node QF is coupled to the gate of the twenty-sixth NMOS transistor N26.

The page buffer PB1 is a circuit coupled to a bit line coupled with memory cells that are subject to being programmed. According to an example, the page buffer PB2 (in FIG. 2A) coupled to the reference bit lines REF_BLE, REF_BLO may be in erased states. According to an exemplary embodiment of the page buffer PB1, the SA 222 may be omitted. Furthermore, after a bit line is precharged, a voltage level of the first sense node SO1 of the page buffer PB1 corresponds to the reference voltage SA_REF. The reference voltage SA_REF used by the page buffer PB1 is obtained from the sense amplifier 222 of the page buffer PB2 of the reference bit lines REF_BLE, REF_BLO and changes as a bit line voltage of the reference bit lines REF_BLE, REF_BLO drops due to the leakage current flowing through unselected memory blocks. That is, after precharging of the bit lines for both of the page buffers PB1 and PB2, a voltage of the reference bit lines REF_BLE, REF_BLO is decreased in response to the leakage current flowing through unselected memory blocks. Accordingly, the SA 222 amplifies a voltage of the second sense node SO2 by performing a comparison using the reference voltage SA_REF obtained from the page buffer PB2 for the reference bit lines REF_BLE, REF_BLO which is changed in response to a voltage decrease caused by the leakage current.

Meanwhile, the SA 222 of the page buffer PB1 is constructed as follows.

Figure 2C:
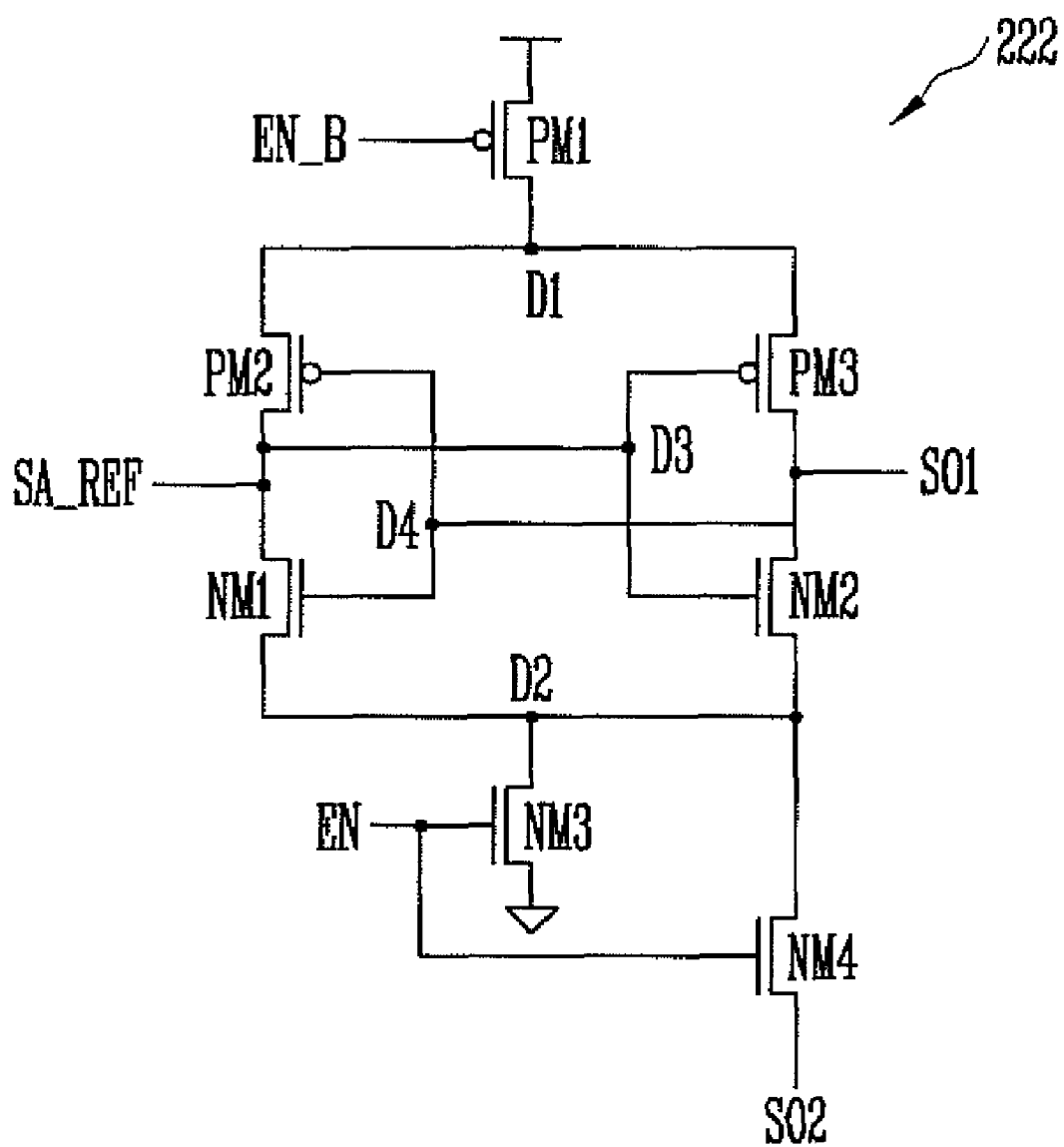
FIG. 2C is a circuit diagram of the sense amplifier shown in FIG. 2B.

FIG. 2C is a circuit diagram of the sense amplifier SA shown in FIG. 2B.

Referring to FIG. 2C, the SA 222 includes first to third PMOS transistors PM1 to PM3 and first to fourth NMOS transistors NM1 to NM4.

The first PMOS transistor PM1 is coupled between the power supply voltage and node D1. An inverted enable signal EN_B is inputted to the gate of the first PMOS transistor PM1.

The second PMOS transistor PM2 and the first NMOS transistor NM1 are coupled in series between the node D1 and node D2. Furthermore, the third PMOS transistor PM3 and the second NMOS transistor NM2 are coupled in series between the node D1 and the node D2.

The gates of the second PMOS transistor PM2 and the first NMOS transistor NM1 are coupled to a node D4. The node D4 is coupled to a point between the third PMOS transistor PM3 and the second NMOS transistor NM2 and is also coupled to the first sense node SO1.

Furthermore, the gates of the third PMOS transistor PM3 and the second NMOS transistor NM2 are coupled to node D3. The node D3 is an intervening node between the second PMOS transistor PM2 and the first NMOS transistor NM1. Here, the reference voltage SA_REF (i.e., the leakage current of unselected memory blocks) received from the reference bit lines REF_BLE, REF_BLO is inputted to the node D3.

The third NMOS transistor NM3 is coupled between the node D2 and the ground node. The fourth NMOS transistor NM4 is coupled between the node D2 and the second sense node SO2. An enable signal EN is inputted to the gates of the third and fourth NMOS transistors NM3, NM4.

The SA 222 is driven in response to the enable signal EN. If voltage of the first sense node SO1 is changed in response to the reference voltage SA_REF, the SA 222 increases the voltage of the second sense node SO2 by a difference between the reference voltage SA_REF and the voltage of the first sense node SO1. According to an example, if a reference voltage SA_REF is decreased by the leakage current corresponding to the reference current SA_REF, a voltage of the first sense node SO1 is decreased.

As such, the SA 222 compensates for a voltage decrease due to leakage current by changing at least the voltage level of the second sense node SO2. Accordingly, a change of the precharged bit line voltage can be prevented/reduced despite the occurrence of leakage current.

A program verification operation using the SA 222 according to an embodiment of the present invention is described below.

Figure 3:
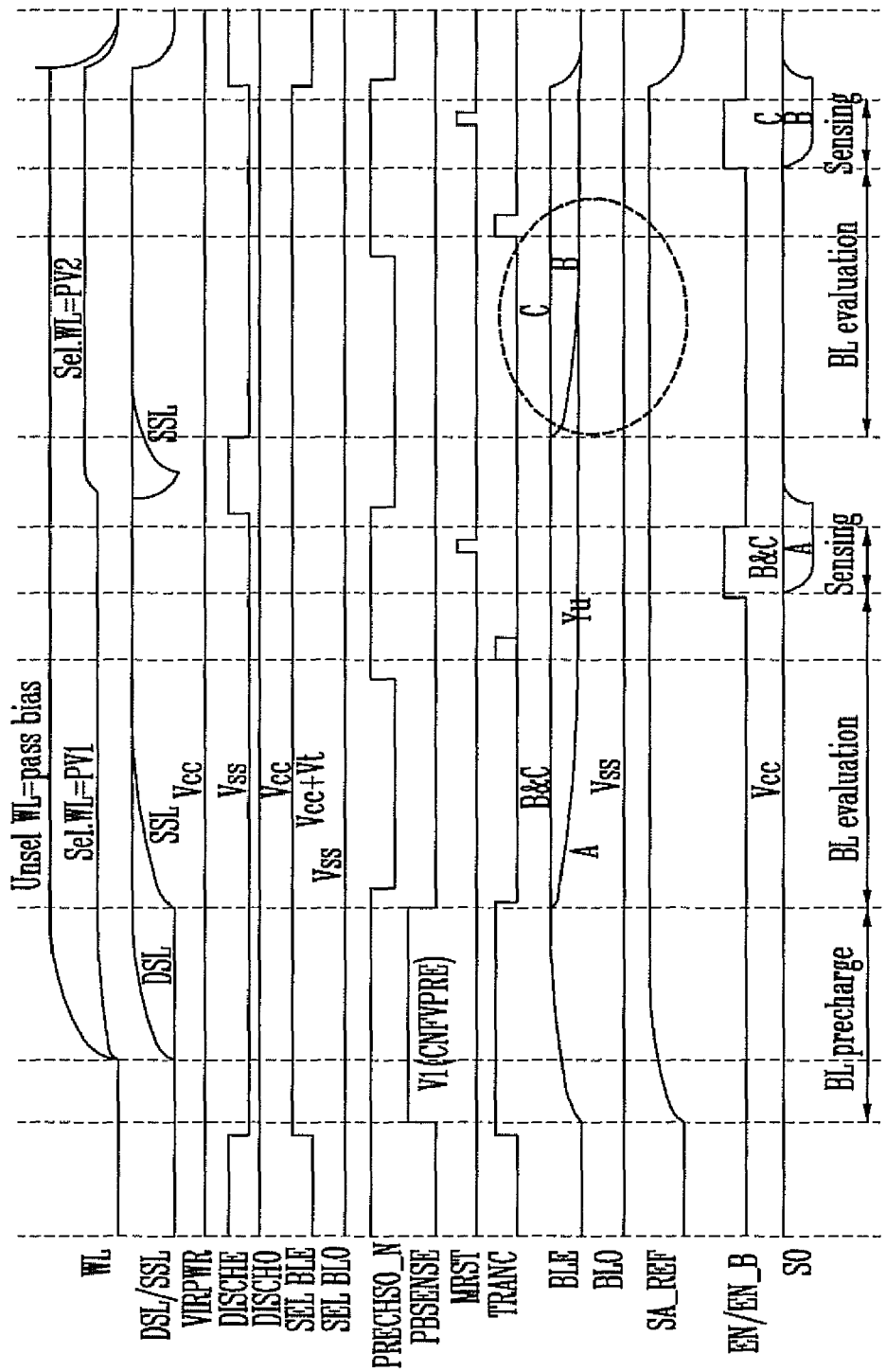
FIG. 3 is a timing diagram illustrating a method of performing a program verification operation according to an embodiment of the present invention.

FIG. 3 is a timing diagram illustrating a method of performing a program verification operation according to an embodiment of the present invention.

Referring to FIG. 3, when the even bit line BLE and a first program verification operation is performed, the even bit line selection signal SELBLE of a high level 'VCC+Vt' is inputted to couple the even bit line BLE and the first sense node SO1 together. Furthermore, the sense control signal PBSENSE of a first voltage (V1) level is applied to precharge the even bit line BLE.

Next, the even bit line BLE is placed into a floating state in order to perform a first evaluation operation. Then, a first verification voltage PV1 is applied to a selected word line, and a pass bias voltage is applied to unselected word lines.

The voltage level of a bit line is changed according to the program state of a selected memory cell coupled to the selected word line.

If the selected memory cell has a threshold voltage larger than the first verification voltage PV1, the memory cell is turned off so that the voltage of the even bit line BLE maintains the precharge state. However, if the selected memory cell has a threshold voltage less than the first verification voltage PV1, the memory cell is turned on so that the even bit line BLE is discharged to, for example, 0V.

After the first evaluation operation is finished, a result of the first evaluation operation is sensed using an enable signal EN. The voltage level of the second sense node SO2 is changed according to the even bit line (BLE) voltage. Next, a result of the first program verification operation is stored in a selected latch.

In the fast program verification operation, a second program verification operation is performed immediately after the first program verification operation without precharging the bit line. To this end, a second evaluation operation is performed by applying a second verification voltage PV2 to the selected word line, and a result of the second evaluation operation is sensed by the second sense node SO2.

Here, the unselected memory blocks remain disabled, but share the bit line with the selected memory block. Accordingly, the leakage current is generated from the unselected memory blocks. Accordingly, since the same leakage current flows through the reference bit lines REF_BLE, REF_BLO, the voltage level of the reference bit lines is decreased by the leakage current.

Accordingly, the voltage level of the first sense node SO1 of a page buffer PB (e.g., PB2) coupled to the reference bit lines is decreased by the leakage current. In this case, the voltage level of the first sense node SO1 of the page buffer PB2 becomes the reference voltage SA_REF.

Furthermore, the SA 222 of the page buffer PB (for example, PB1 as shown) coupled to the even bit line BLE on which a program operation is being performed compares the reference voltage SA_REF and voltage of the first sense node SO1 and increases the voltage level of the second sense node SO2 by a difference between reference voltage SA_REF and voltage of the first sense node SO1.

While the evaluation operation is performed according to the second verification voltage PV2, an unwanted reduction in the bit line voltage resulting from the leakage current can be compensated for by the operation of the SA 222.

Accordingly, verification data can continue to be sensed according to a degree in which a selected memory cell is programmed. Furthermore, since the voltage decrease resulting from the leakage current flowing through unselected memory blocks is compensated for by the SA 222, program verification operations using third and fourth verification voltages PV3, PV4 can be performed subsequently after the second program verification operation.

As described above, in accordance with the page buffer circuit and the nonvolatile memory device according to the present disclosure, when a fast program verification operation is performed, a larger number of program verification operations can be performed through one precharging of a bit line. Accordingly, the time that it takes to perform a program operation can be reduced.

What is claimed is:

1. A page buffer circuit, comprising:
   a sense amplification unit configured to compare a reference voltage and a bit line voltage of a bit line of a selected memory block and to increase a voltage level of a sense node by a difference between the reference voltage and the bit line voltage, wherein the bit line voltage is subject to being changed according to a program state of a selected memory cell; and
   a number of latch circuits configured to latch program verification data according to the voltage level of the sense node.

2. The page buffer circuit of claim 1, wherein the reference voltage is a voltage that changes according to a voltage decrease resulting from a leakage current of the bit line when the bit line is precharged, wherein the bit line is shared by the selected memory block with unselected memory blocks.

3. The page buffer circuit of claim 1, wherein the sense amplification unit comprises an amplification circuit with components that are cross-coupled.

4. A nonvolatile memory device, comprising:
   a memory cell array including a number of memory blocks, each memory block comprising memory cells coupled to a number of word lines and a number of bit lines to form a first bit line group and a second bit line group; and
   a page buffer unit configured to include page buffers, each page buffer being coupled to at least one of first bit lines included in the first bit line group and configured to, when a program verification operation is performed, compare a second bit line voltage changed by a voltage decrease resulting from a leakage current from a second bit line included in the second bit line group and a first bit line voltage of a first bit line included in the first bit line group, the first bit line voltage being changed according to a program state of a selected memory cell, increase a voltage level of a sense node by a difference between the first and second bit line voltages, and store verification data according to the voltage level of the sense node.

5. The nonvolatile memory device of claim 4, wherein first select transistors configured to couple the second bit line group and a cell string together in the second bit line group are configured to remain in a turn-off state.

6. The nonvolatile memory device of claim 5, wherein a ground node is coupled with gates of the first select transistors.

7. The nonvolatile memory device of claim 5, wherein the page buffer unit comprises:
   a sense amplification unit configured to compare the first bit line voltage and the second bit line voltage and to increase the voltage level of the sense node, coupled with the first bit line by a difference between the first and second bit line voltages; and
   a number of latch circuits configured to latch the verification data according to the voltage level of the sense node.

8. The nonvolatile memory device of claim 7, wherein the second bit line voltage corresponds to a voltage that changes according to a voltage decrease of the second bit line resulting from a leakage current of the bit line when the second bit line is precharged, wherein the bit line is shared by a selected memory block with unselected memory blocks of the memory cell array.

9. The nonvolatile memory device of claim 7, wherein the sense amplification unit comprises an amplification circuit with components that are cross-coupled.

10. A nonvolatile memory device, comprising:
    a memory cell array including a number of memory blocks, each memory block comprising memory cells coupled to a number of word lines and a number of bit lines; and
    a voltage control unit configured to, in response to a voltage decrease resulting from a leakage current of a bit line shared by a memory block selected for program with unselected memory blocks of the memory cell array, and to increase a voltage level of a sense node of a page buffer by an amount of the voltage decrease before verification data are checked in a fast program verification operation of the selected memory block.

* * * * *